United States Patent
Krasulick et al.

(10) Patent No.: US 11,307,440 B2
(45) Date of Patent: Apr. 19, 2022

(54) ON-CHIP HIGH CAPACITANCE TERMINATION FOR TRANSMITTERS

(71) Applicant: Skorpios Technologies, Inc., Albuquerque, NM (US)

(72) Inventors: Stephen B. Krasulick, Albuquerque, NM (US); Damien Lambert, Los Altos, CA (US); Andrew Bonthron, Los Angeles, CA (US); Guoliang Li, Albuquerque, NM (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 16/843,761

(22) Filed: Apr. 8, 2020

(65) Prior Publication Data
US 2020/0371383 A1    Nov. 26, 2020

Related U.S. Application Data

(62) Division of application No. 15/656,137, filed on Jul. 21, 2017, now Pat. No. 10,678,073.

(60) Provisional application No. 62/365,862, filed on Jul. 22, 2016.

(51) Int. Cl.
| | |
|---|---|
| *G02B 6/26* | (2006.01) |
| *G02F 1/01* | (2006.01) |
| *G02F 1/017* | (2006.01) |
| *H03H 7/38* | (2006.01) |
| *G02F 1/015* | (2006.01) |

(52) U.S. Cl.
CPC ......... *G02F 1/01708* (2013.01); *G02F 1/017* (2013.01); *G02F 1/0121* (2013.01); *H03H 7/38* (2013.01); *G02F 1/0157* (2021.01); *G02F 2201/06* (2013.01); *G02F 2202/108* (2013.01); *H01L 2224/73265* (2013.01)

(58) Field of Classification Search
CPC .... G02F 1/01708; G02F 1/0121; G02F 1/017; H03H 7/38
USPC ........................................................... 385/2
See application file for complete search history.

(56) References Cited

U.S. PATENT DOCUMENTS

| | | | | |
|---|---|---|---|---|
| 5,774,614 | A * | 6/1998 | Gilliland | G02B 6/4224 385/88 |
| 5,780,875 | A | 7/1998 | Tsuji et al. | |
| 6,393,171 | B2 | 5/2002 | Sasaki et al. | |
| 6,459,562 | B1 * | 10/2002 | KarRoy | H01L 21/76826 361/312 |
| 6,690,845 | B1 * | 2/2004 | Yoshimura | G02B 6/12002 257/E23.01 |
| 7,778,501 | B2 * | 8/2010 | Beausoleil | B82Y 20/00 385/14 |
| 8,463,088 | B1 | 6/2013 | Asghari et al. | |
| 9,274,275 | B2 * | 3/2016 | Webster | G02B 6/30 |

(Continued)

OTHER PUBLICATIONS

International Application No. PCT/US2017/043301 received a Search Report and Written Opinion dated Nov. 2, 2017, 5 pages.

(Continued)

*Primary Examiner* — Kaveh C Kianni
(74) *Attorney, Agent, or Firm* — Kilpatrick Townsend & Stockton LLP

(57) ABSTRACT

A modulator and a capacitor are integrated on a semiconductor substrate for modulating a laser beam. Integrating the capacitor on the substrate reduces parasitic inductance for high-speed optical communication.

10 Claims, 5 Drawing Sheets

(56) References Cited

U.S. PATENT DOCUMENTS

| | | | | |
|---|---|---|---|---|
| 9,625,651 B2* | 4/2017 | Kumar | ................... | G02B 6/305 |
| 10,678,073 B2 | 6/2020 | Krasulick et al. | | |
| 2001/0053165 A1* | 12/2001 | Wang | ................. | H04B 10/5051 |
| | | | | 372/38.02 |
| 2002/0021873 A1* | 2/2002 | Patzelt | ................. | G02B 6/4284 |
| | | | | 385/88 |
| 2002/0097962 A1* | 7/2002 | Yoshimura | .............. | H01L 23/48 |
| | | | | 385/50 |
| 2003/0090774 A1* | 5/2003 | Singh | ................. | G02F 1/01708 |
| | | | | 359/248 |
| 2005/0058385 A1* | 3/2005 | Tanbakuchi | .......... | G02F 1/0121 |
| | | | | 385/1 |
| 2012/0126224 A1* | 5/2012 | Arai | ...................... | G11C 11/403 |
| | | | | 257/43 |
| 2014/0184314 A1* | 7/2014 | Takahashi | .......... | G01R 31/3833 |
| | | | | 327/524 |
| 2015/0098676 A1* | 4/2015 | Krasulick | ........... | H01S 5/02326 |
| | | | | 385/14 |
| 2016/0005872 A1* | 1/2016 | Kurata | ................. | H01L 27/124 |
| | | | | 257/43 |
| 2016/0154177 A1 | 6/2016 | Han et al. | | |
| 2016/0154185 A1* | 6/2016 | Mori | ................... | G02B 6/4295 |
| | | | | 385/56 |
| 2016/0202501 A1 | 7/2016 | Bach et al. | | |
| 2016/0246016 A1 | 8/2016 | Mizrahi et al. | | |
| 2016/0306111 A1* | 10/2016 | Lambert | ................ | G02B 6/125 |
| 2017/0227709 A1 | 8/2017 | Lambert | | |
| 2017/0230117 A1 | 8/2017 | Li et al. | | |
| 2017/0331248 A1 | 11/2017 | Lambert | | |

OTHER PUBLICATIONS

U.S. Appl. No. 15/656,137 received a Non-Final Office Action dated Oct. 4, 2018, 11 pages.

U.S. Appl. No. 15/656,137 received a Final Office Action dated Mar. 27, 2019, 13 pages.

* cited by examiner

ON-CHIP HIGH CAPACITANCE TERMINATION FOR TRANSMITTERS

CROSS-REFERENCES TO RELATED APPLICATIONS

This application is a divisional of U.S. Nonprovisional patent application Ser. No. 15/656,137, filed on Jul. 21, 2017, entitled "On-Chip High Capacitance Termination For Transmitters," which claims priority to U.S. Provisional Patent Application No. 62/365,862, filed on Jul. 22, 2016, entitled "On-Chip High Capacitance Termination For Transmitters," the disclosures of which are hereby incorporated by reference in their entirety for all purposes.

BACKGROUND

This application relates to integrating optical and electrical components on a silicon substrate. Silicon integrated circuits ("ICs") have dominated the development of electronics and many technologies based upon silicon processing having been developed over the years. Their continued refinement led to nano-scale feature sizes that can be important for making CMOS (complementary metal-oxide-semiconductor) circuits. On the other hand, silicon is not a direct-bandgap material. Although direct-bandgap materials, including III-V compound semiconductor materials, have been developed, there is a need in the art for improved methods and systems related to photonic ICs utilizing silicon substrates.

BRIEF SUMMARY

Embodiments of the present invention provide devices, systems, and/or methods of a composite device, such combining functionality of two different semiconductor materials to create an optical device. A capacitor is mounted on a silicon-photonics device to reduce impedance mismatch between a driver and a modulator. The capacitor is mounted on the silicon-photonics device to reduce parasitic inductance during high frequency modulation. In some embodiments, a method to improve RF performance of an EAM device by integrating a high capacitance component and solid ground planes very close to the EAM device is disclosed (e.g., within 20, 50, 100, 125, 200, 500, and/or 1,000 µm and/or not closer than 0.1, 1, 2, and/or 5 µm).

In some embodiments, a device for modulating light from a semiconductor laser comprises: a platform, wherein: the platform comprises a substrate, the substrate is made of a first semiconductor material, the platform comprises a first optical waveguide integrated on the substrate, and/or the platform comprises a ground plane integrated on the substrate; a chip, wherein: the chip is integrated on the substrate, the chip is made of a second semiconductor material, the chip comprises a second optical waveguide, and/or the second optical waveguide is optically aligned with the first optical waveguide; a contact, wherein: the contact is integrated on the substrate, and/or the contact is electrically connected with the chip; and/or a capacitor, wherein: the capacitor is integrated on the substrate, and/or the capacitor is electrically connected with the contact. In some embodiments, the device further comprises a resistor integrated on the substrate electrically between the contact and the capacitor. In some embodiments, the chip is electrically between the contact and the ground plane; the capacitor is electrically between the contact and the ground plane; the contact is electrically connected with the chip via a vertical plug; the chip is integrated on the substrate by being bonded to the platform; the chip is integrated on the substrate by being bonded to the substrate; the chip is bonded in a recess of the platform; the second optical waveguide is optically aligned with the first optical waveguide by butt coupling; the chip comprises multi-quantum wells; the capacitor has a capacitance between 50 and 10,000 picofarads; the substrate is mounted on a printed circuit board; and/or the capacitor is within 20, 50, 100, 200, 500, and/or 1,000 µm of the chip.

In some embodiments, a method for creating a modulator for a semiconductor laser comprises: bonding a chip to a platform, wherein the platform comprises a substrate; forming a contact integrated on the substrate; forming a ground plane integrated on the substrate, wherein the chip is electrically between the contact and the ground plane; and/or bonding a capacitor to the platform, wherein: the capacitor is integrated on the substrate, and/or the capacitor is electrically between the contact and the ground plane. In some embodiments, the method comprises applying a modulation signal to the contact, wherein the chip is used as an electro absorption modulator. In some embodiments, the capacitor has a capacitance between 500 and 900 picofarads.

In some embodiments, a method for modulating a semiconductor modulator comprises: applying a modulation signal to a contact, wherein the contact is integrated on a substrate; transmitting a first part of the modulation signal to a semiconductor structure, wherein: the semiconductor structure has a direct bandgap, the semiconductor structure is integrated on the substrate, the semiconductor structure comprises an optical waveguide, and/or the first part of the modulation signal applied to the semiconductor structure modulates an optical beam in the optical waveguide of the semiconductor structure; and/or shunting a second part of the modulation signal through a capacitor that is integrated on the substrate. In some embodiments, the method comprises: bonding the semiconductor structure to the substrate to integrate the semiconductor structure on the substrate; forming the contact integrated on the substrate; forming a ground plane integrated on the substrate, wherein the semiconductor structure is electrically between the contact and the ground plane; and/or bonding the capacitor to the substrate, wherein the capacitor is electrically between the contact and the ground plane. In some embodiments, the modulation signal has a frequency between 2 and 100 gigahertz; the modulation signal modulates an optical beam guided in the semiconductor structure; and/or the capacitor is within 200 µm of the semiconductor structure.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DESCRIPTION

The ensuing description provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

Embodiments relate generally to a platform bonded to a chip to form a composite device. For example, a platform (e.g., a silicon platform) can be bonded to a semiconductor of different material (e.g., III-V). Though making devices with silicon has some advantages (e.g., cost and developed fabrication methods), silicon is not a direct-bandgap material. In certain applications, it is desirable to have a direct-bandgap material (e.g., for a laser gain medium). Thus, a chip made of a semiconductor material having a direct bandgap is integrated with a silicon platform.

Achieving high Radio Frequency (RF) performance at high frequency, such as 1 GHz to 50 GHz, 500 GHz, or beyond, on silicon photonics chips containing an EAM (electro absorption modulator) device is challenging, especially with high-level of integration of EAM devices. The challenge comes from an impedance mismatch between an EAM device (e.g., built from III-V material) and a 50 ohms impedance line carrying RF signals from a driver to the EAM devices Some efforts can be done to improve impedance matching and termination. For example, adjusting a layout of the PCB (printed circuit board) and/or adding one or more resistors and/or capacitors on the PCB board can help improve impedance matching. However, in those efforts, EAM chips are very close to the PCB board, and a high-density of modulator devices is difficult to achieve due to space constraints. Some III-V designs and/or silicon-photonics designs lack optimization of RF grounding and/or modulator termination impedance.

In some embodiments, one or more of the following are achieved: improved and/or optimized RF layout for better high frequency EAM eyes; improved grounding surrounding EAM devices; and/or improved termination impedance with high capacitance close to an EAM device.

Figure 1:
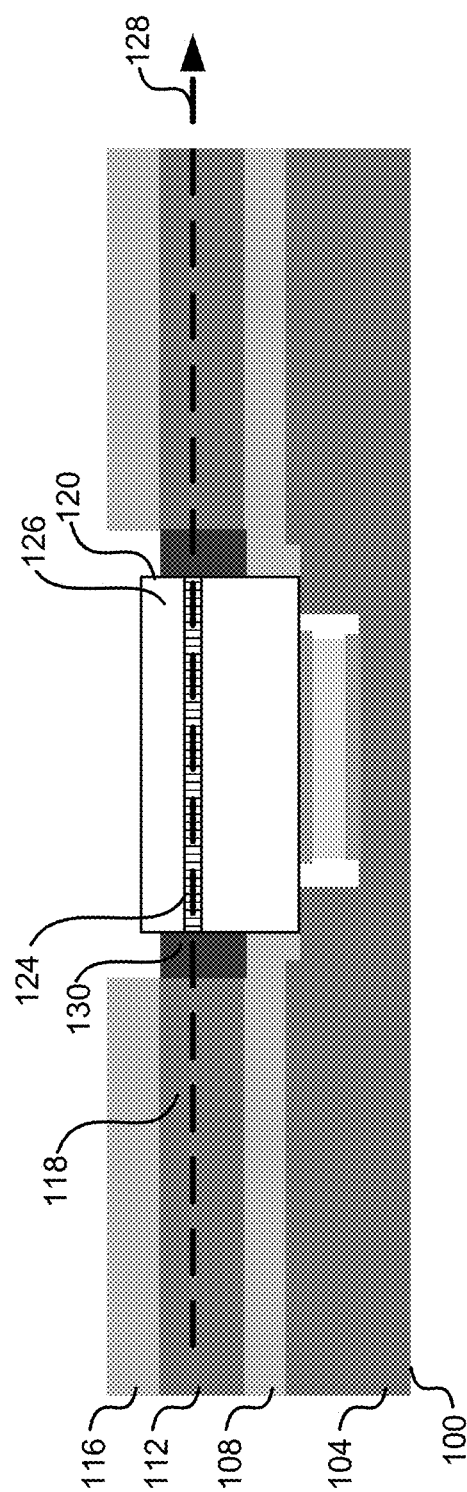
FIG. 1 depicts an embodiment of a simplified cross-sectional side view of a chip bonded to a substrate.

Referring first to FIG. 1, a platform 100 is shown. The platform 100 comprises a base layer 104, a lower layer 108 on top of the base layer 104, a device layer 112 on top of the lower layer 108, and an upper layer 116 on top of the device layer 112. The base layer 104 is made of a first semiconductor material. For example, in some embodiments, the base layer 104 is a crystalline silicon substrate; the lower layer 108 is an oxide layer (e.g., SiO2); the device layer 112 is made of crystalline silicon; and the upper layer 116 is an oxide layer (e.g., SiO2). In some embodiments, the base layer 104, the lower layer 108, and the device layer 112 started as a silicon on insulator (SOI) wafer (e.g., the base layer 104 is a handle; the lower layer 108 is a buried oxide layer (BOX); and the device layer 112 is a device layer of the SOI wafer). In this embodiment, the device layer 112 has been processed (e.g., waveguide(s), mirror(s), and/or grating(s) have been formed in the device layer 112) and the upper layer 116 covers the device layer 112 (e.g., as an upper cladding) to create the platform 100. In some embodiments, the device layer 112 comprises a first waveguide 118, and the lower layer 108 and the upper layer 116 act as cladding material for the waveguide (the device layer 112 having a higher index of refraction than the lower layer 108 and the upper layer 116).

A chip 120 is bonded to the platform 100. In some embodiments, the chip 120 is bonded to the base layer 104. In some embodiments, the base layer 104 is referred to as a substrate. In some embodiments, the chip 120 is bonded in a recess of the platform. The chip 120 comprises an active region 124. In some embodiments, the chip 120 comprises a second waveguide 126 (e.g., in the active region 124). An arrow shows a direction of beam propagation 128 from left to right.

In some embodiments, the chip 120 is bonded to the platform 100 as described in U.S. patent application Ser. No. 14/509,914, filed on Oct. 8, 2014, and/or U.S. patent application Ser. No. 15/592,704, filed on May 11, 2017, the disclosure of each is incorporated by reference for all purposes.

The first waveguide 118 is butt-coupled with the second waveguide 126. In some embodiments, a third waveguide 130 couples the first waveguide 118 with the second waveguide 126. In some embodiments, the third waveguide 130 is referred to as an optical bridge. In some embodiments the third waveguide is formed as described in U.S. patent application Ser. No. 14/996,001, filed on Jan. 14, 2016 and/or U.S. patent application Ser. No. 15/426,366, filed on Feb. 7, 2017, the disclosure of each is incorporated by reference for all purposes.

Figure 2:
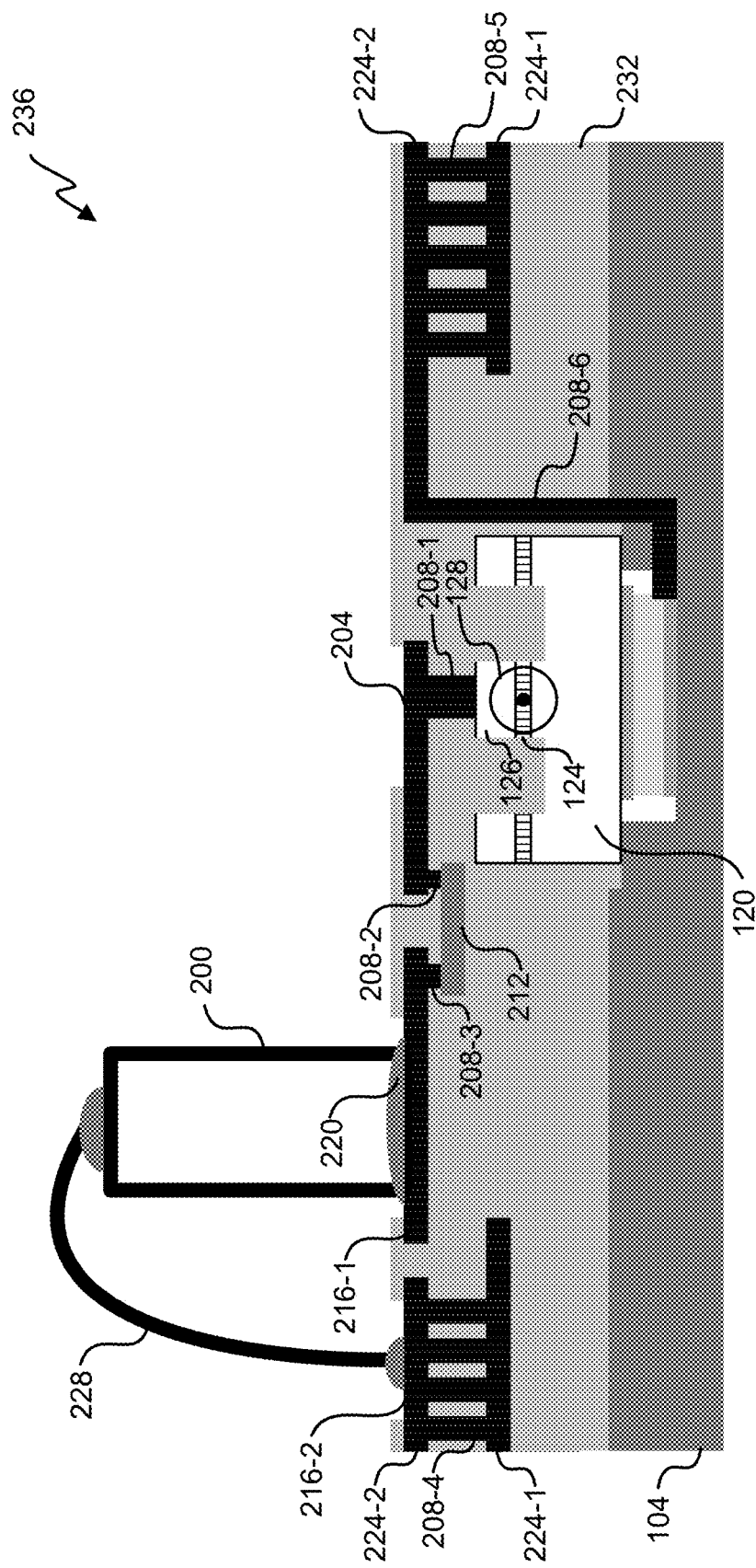
FIG. 2 depicts an embodiment of a simplified cross-sectional side view a capacitor integrated on the substrate.

FIG. 2 depicts an embodiment of a simplified cross-sectional side view a capacitor 200 integrated on the substrate (e.g., integrated on the base layer 104). The cross section is rotated by 90 degrees compared to FIG. 1 so that the direction of beam propagation 128 is coming out of the page. A contact 204 is integrated on the substrate. The contact 204 is electrically connected with the chip 120. In some embodiments, a first plug 208-1 is formed through a via connecting the contact 204 with the chip 120.

The capacitor 200 is electrically connected with the contact 204. In some embodiments, a resistor 212 electrically connects the contact 204 with the capacitor 200. The capacitor 200 is bonded to a first pad 216-1. In some embodiments, a conductive epoxy 220 is applied to attach the capacitor 200 to the first pad 216-1. A second plug 208-2 connects the contact 204 with the resistor 212. A third plug 208-3 connects the resistor 212 with the first pad 216-1.

A first ground plane 224-1 and/or a second ground plane 224-2 are integrated on the substrate. The first ground plane 224-1 is electrically connected with the second ground plane 224-2 with a fourth plug 208-4, a fifth plug 208-5, and/or more plugs. In some embodiments, the first ground plane 224-1 and the second ground plane 224-2 have overlapping areas to further increase capacitance. In some embodiments, the first ground plane 224-1 is not used. The chip 120 is electrically connected with the second ground plane 224-2 via a sixth plug 208-6.

The capacitor 200 is electrically connected with the second ground plane 224-2 at a second pad 216-2 by a wire bond 228. The first ground plane 224-1 is formed as a first metal layer. The second ground plane 224-2, the first pad 216-1, and/or the contact 204 are formed concurrently as a second metal layer. Insulating material 232 (e.g., SiO2) is used to electrically insulate features and/or to provide material for integrating features (e.g., the first metal layer, the second metal layer, plugs 208, and/or the resistor 212) onto the substrate (e.g., base layer 104).

In some embodiments, the chip 120 and the capacitor 200 integrated on the substrate form an optical device 236 for modulating light for optical communication. In some embodiments, the chip 120 comprises a direct bandgap material (e.g., III-V or II-VI material, such as InP or GaAs). The active region 124 comprises a multi-quantum well structure.

In some embodiments, a high capacitance capacitor is used (e.g., 50-10,000, 100-5,000, 200-1000, 400-900, 500-750, 600, 650, 660, 670, 680, 690, and/or 700 picofarad capacitor). In some embodiments, the capacitor 200 fits on an area equal to or less than 225 mm$^2$. A high capacitance capacitor is not easily integrated on an electronics chip. Plugs 208 are used to create robust connections. The capacitor 200 provides high on-chip capacitance for EAM termination.

Figure 3:
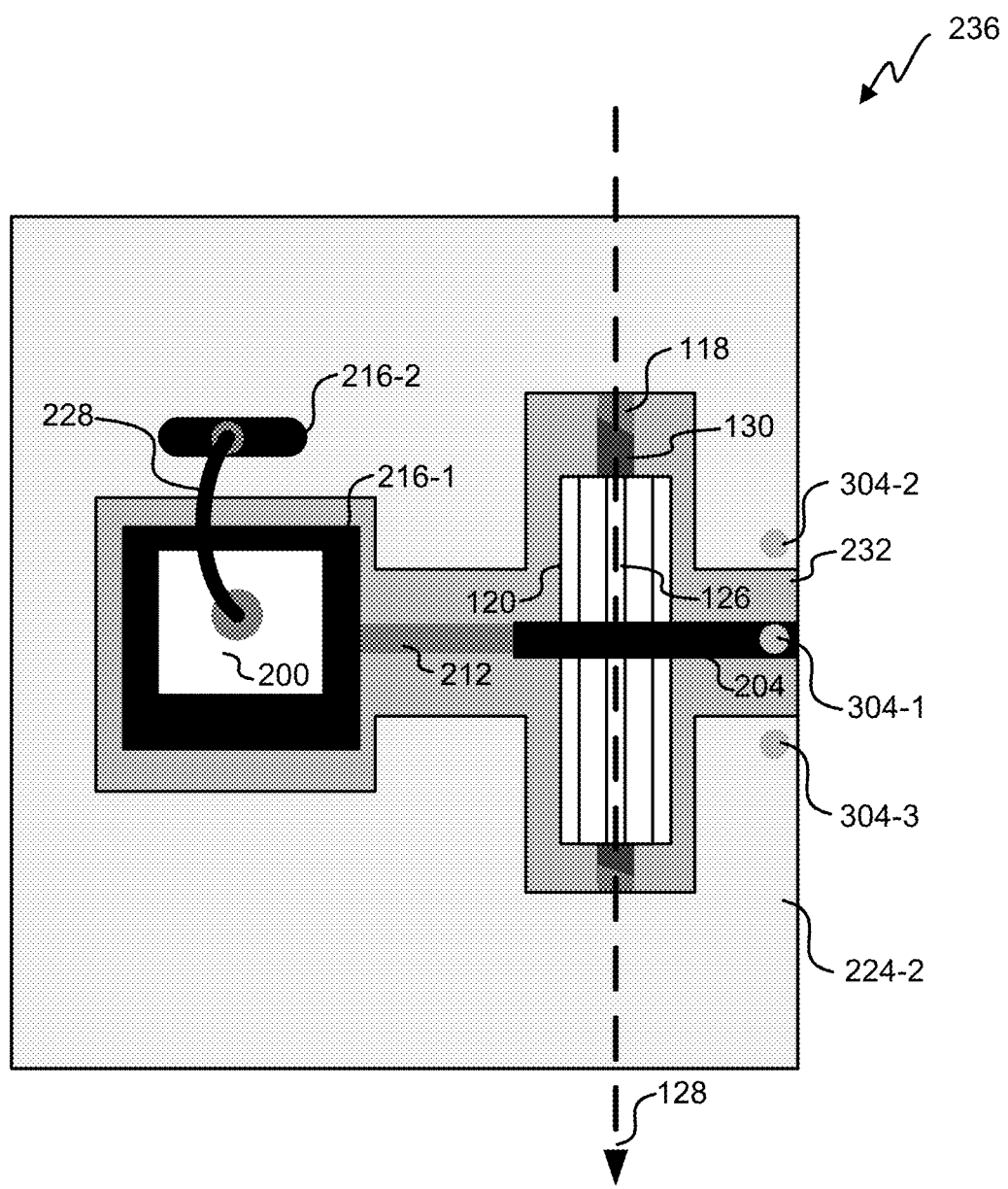
FIG. 3 depicts an embodiment of a simplified top view of the capacitor integrated on the substrate.

FIG. 3 depicts an embodiment of a simplified top view of the capacitor 200 integrated on the substrate. In some embodiments, the substrate is integrated on a PCB. The optical device 236 comprises a first RF bond pad 304-1, a second RF bond pad 304-2, and third RF bond pad 304-3. The first RF bond pad 304-1 connects to the contact 204. The second RF bond pad 304-2 and/or the third RF bond pad 304-3 connect to the second ground plane 224-2. A signal is applied to the first bond pad 304-1. The signal changes electrical potential and/or current through the chip 120, which is used to modulate an optical beam traveling through the chip 120. In some embodiments, a metal ridge extends on top of the second waveguide 126 in the direction of beam propagation. In some embodiments, vertical is a direction looking into or out of the page in FIG. 3 (e.g., a direction normal to an un-etched surface of the substrate. In some embodiments, plugs 208 are vertical plugs (e.g., plug 208 extends vertically to connect a first component separated by a vertical distance from a second component). Horizontal is orthogonal to vertical and orthogonal to the direction of beam propagation 128.

Figure 4:
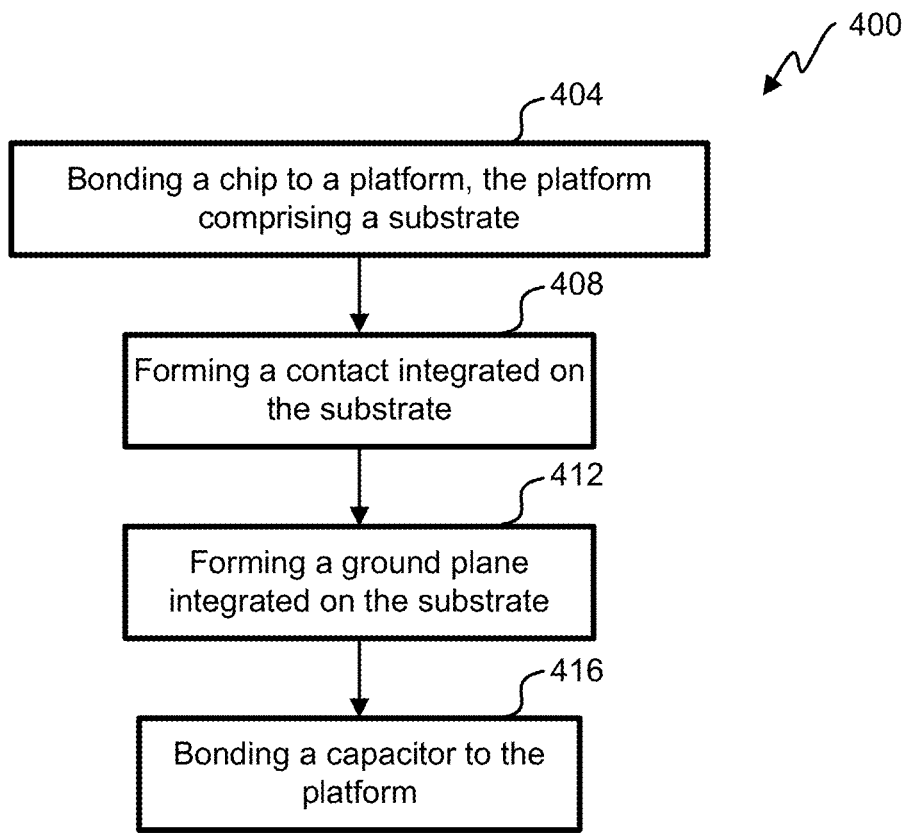
FIG. 4 illustrates a flowchart of an embodiment of a process for creating a modulator for a semiconductor laser.

FIG. 4 illustrates a flowchart of an embodiment of a process 400 for creating a modulator for a semiconductor laser. Process 400 begins in step 404 with bonding the chip 120 to the platform 100. The platform 100 comprises a substrate (e.g., base layer 104). In step 408, a contact (e.g., contact 204) is formed, wherein the contact 204 is integrated on the substrate. In step 412, a ground plane is formed, wherein the ground plane is integrated on the substrate. The chip 120 is electrically between the contact 204 and the ground plane 224. In some embodiments, steps 408 and 412 are performed concurrently. In step 416, a capacitor is bonded to the platform 100, integrating the capacitor on the substrate. The capacitor is electrically between the contact 204 and the ground plane 224.

Figure 5:
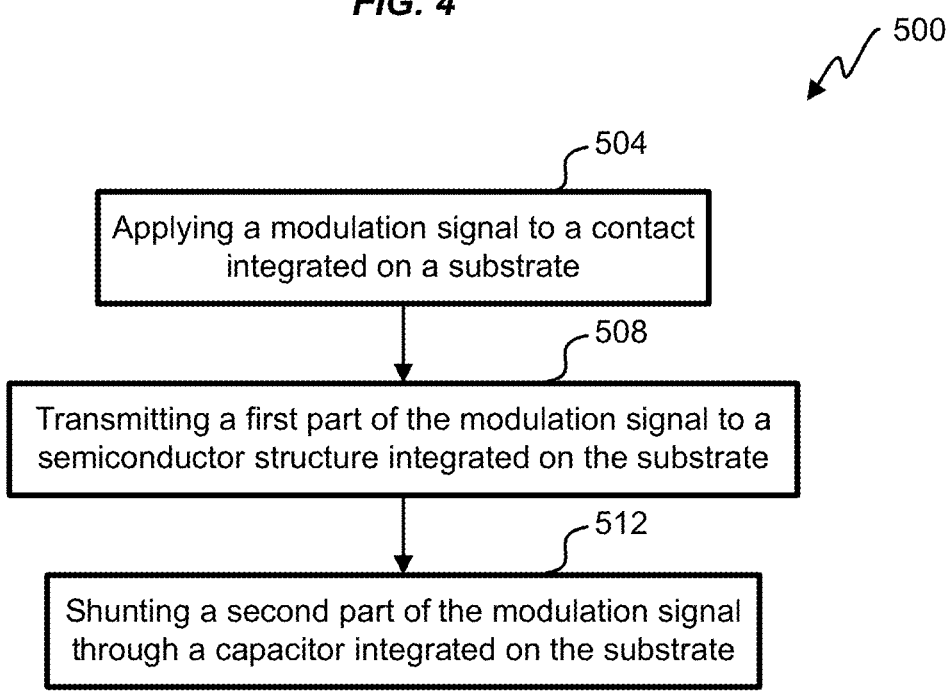
FIG. 5 illustrates a flowchart of an embodiment of a process for modulating a semiconductor modulator.

FIG. 5 illustrates a flowchart of an embodiment of a process 500 for modulating a semiconductor modulator. A semiconductor laser generates an optical beam. In some embodiments, the optical beam is generated using another chip integrated on the base layer 104. The optical beam is guided to the chip 120 by the first waveguide 118. In step 504, a modulation signal is applied to the contact 204. The contact 204 is integrated on the substrate. A first part of the modulation signal is transmitted to a semiconductor structure (e.g., chip 120), step 508. The semiconductor structure has a direct bandgap. The semiconductor structure is integrated on the substrate. The semiconductor structure comprises an optical waveguide (e.g., the second waveguide 126). The first part of the modulation signal modulates an optical beam in the optical waveguide. In step 512, a second part of the modulation signal is shunted to a capacitor (e.g., capacitor 200) that is integrated on the substrate.

In some embodiments, the capacitor 200 is used to mitigate impedance mismatch. By having the capacitor 200 integrated on the substrate, and the wire bond 228 grounded to the ground plane 224 (wherein the ground plane 224 is integrated on the substrate), a length of the wire bond 228 is shortened (e.g., as compared to having the capacitor 200 off the substrate). A wire bond 228 that is shorter helps mitigate parasitic inductance in the wire bond 228. Parasitic inductance increases with increased frequency. In some embodiments, an RF frequency between 1 and 500 GHz, between 5 and 150 GHz, between 10 and 60 GHz, and/or between 20 and 30 GHz is applied to the contact 204 (e.g., 25 GHz, 50 GHz).

In some embodiments, a device (e.g., for modulating a semiconductor modulator) comprises a substrate; a semiconductor structure, wherein: the semiconductor structure has a direct bandgap, and the semiconductor structure is integrated on the substrate; and a capacitor integrated on the substrate. For example, instead of bonding the chip 120 to the substrate, a semiconductor structure (e.g., multi-quantum wells) is grown on the substrate (e.g., grown on an InP or GaAs substrate).

Figure 6:
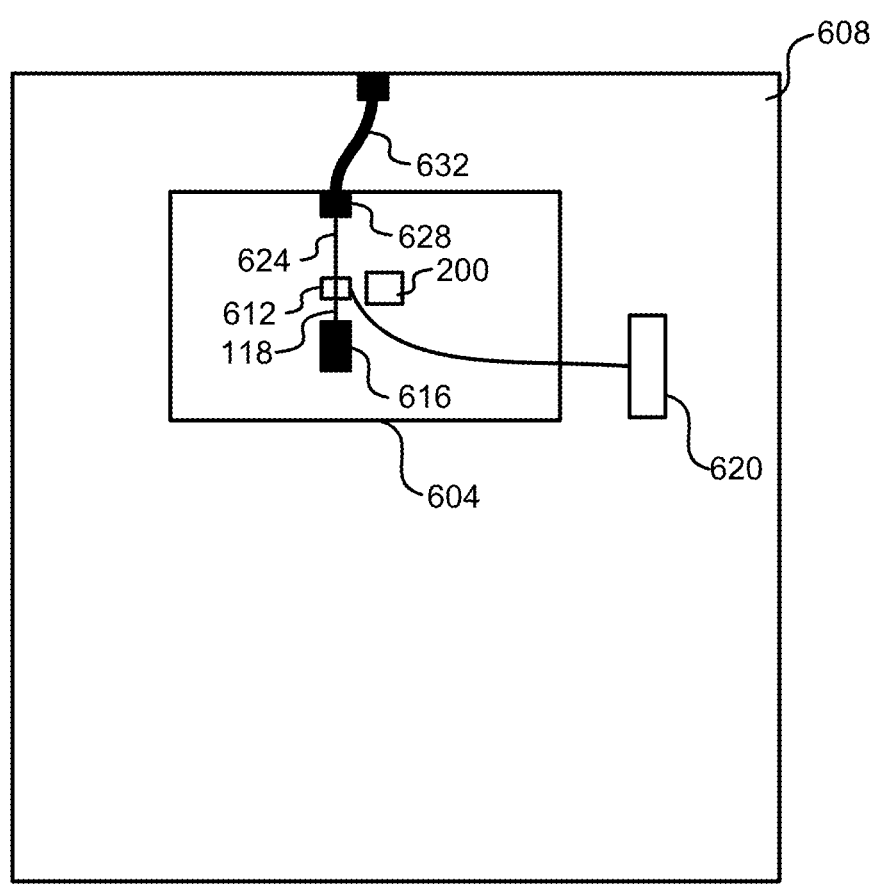
FIG. 6 depicts a simplified diagram of an embodiment of a substrate integrated on a PCB.

FIG. 6 depicts a simplified diagram of an embodiment of a substrate 604 integrated on a PCB 608. In some embodiments, the substrate 604 is the base layer 104. An EAM device 612 (e.g., comprising the chip 120) is integrated on the substrate 604. The capacitor 200 is integrated on the substrate 604. A laser 616 is integrated on the substrate 604. Light from the laser 616 is transmitted through the first waveguide 118 (which is also integrated on the substrate 604) to the second waveguide 126 of the chip 120, which is part of the EAM device 612. A driver 620 is used to generate an electrical signal to send to the EAM device 612. Light from the laser 616 is modulated at the EAM device 612 and transmitted to a third waveguide 624. In some embodiments, the third waveguide 624 is a semiconductor waveguide (e.g., made of crystalline silicon in the device layer 112). An optical coupler 628 expands an optical beam from the third waveguide 624 to couple with an optical fiber 632. An example of an optical coupler 628 from a semiconductor waveguide to an optical fiber is given in U.S. patent application Ser. No. 14/615,942, filed on Feb. 6, 2015, which is incorporated by reference for all purposes.

The above description of exemplary embodiments has been presented for the purposes of illustration and description. It is not intended to be exhaustive or to limit the invention to the precise form described, and many modifications and variations are possible in light of the teaching above. For example, in some embodiments the chip 120 is used as a modulator as described in U.S. patent application Ser. No. 15/426,823, filed on Feb. 7, 2017, the disclosure of which is incorporated by reference. Thus, the optical device 236 could comprise multiple modulators (e.g., two, four, and or eight) with multiple capacitors 200 (e.g., two, four, and/or eight capacitors). In some embodiments, the capacitor 200 is integrated on the substrate in lieu of, or in addition to, sharp bends in waveguides as described in the '823 application.

The embodiments were chosen and described in order to explain the principles of the invention and its practical applications to thereby enable others skilled in the art to utilize the invention in various embodiments and with various modifications as are suited to the particular use contemplated.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

Also, it is noted that the embodiments may be described as a process which is depicted as a flowchart, a flow diagram, a data flow diagram, a structure diagram, or a block diagram.

Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary.

All patents, patent applications, publications, and descriptions mentioned here are incorporated by reference in their entirety for all purposes. None is admitted to be prior art.

What is claimed is:

1. A method for modulating a semiconductor modulator, the method comprising:
    applying a modulation signal to a contact, wherein the contact is integrated on a substrate that is part of a platform;
    transmitting the modulation signal to a semiconductor structure, wherein:
        the semiconductor structure has a direct bandgap,
        the semiconductor structure is integrated on the substrate,
        the semiconductor structure is bonded within a recess of the platform,
        the semiconductor structure comprises a first optical waveguide,
        the first optical waveguide is a semiconductor waveguide, and
        the modulation signal applied to the semiconductor structure modulates an optical beam in the first optical waveguide of the semiconductor structure to form a modulated beam;
    shunting the semiconductor structure with a capacitor that is integrated on the substrate; and
    transmitting the modulated beam from the first optical waveguide into a second optical waveguide, wherein:
        the second optical waveguide is part of the platform, and
        the second optical waveguide is a semiconductor waveguide.

2. The method of claim 1, further comprising:
    bonding the semiconductor structure to the platform;
    forming the contact integrated on the substrate;
    forming a ground plane integrated on the substrate, wherein the semiconductor structure is electrically between the contact and the ground plane; and
    bonding the capacitor to the platform, wherein the capacitor is electrically between the contact and the ground plane.

3. The method of claim 1, wherein:
    the first optical waveguide is disposed in a first semiconductor material; and
    the second optical waveguide is disposed in a second semiconductor material, different from the first semiconductor material.

4. The method of claim 3, wherein a third optical waveguide is disposed in the second semiconductor material of the platform, and the method further comprises transmitting the optical beam from the third optical waveguide into the first optical waveguide.

5. The method of claim 4, wherein the second semiconductor material is crystalline silicon.

6. The method of claim 5, wherein the first semiconductor material is a III-V compound.

7. The method of claim 4, further comprising expanding the optical beam using an optical coupler integrated on the substrate.

8. The method of claim 1, wherein the modulation signal has a frequency between 2 and 100 gigahertz.

9. The method of claim 1, wherein the capacitor is within 200 μm of the semiconductor structure.

10. The method of claim 1, further comprising generating the optical beam using a laser integrated on the substrate.

* * * * *